(12) United States Patent
Lee et al.

(10) Patent No.: US 7,659,140 B2
(45) Date of Patent: Feb. 9, 2010

(54) INTEGRATED CIRCUIT SYSTEM WITH A DEBRIS TRAPPING SYSTEM

(75) Inventors: Taewoo Lee, Icheon-Si (KR); Sang-Ho Lee, Kyounggi (KR); BoHan Yoon, Icheon-Si (KR)

(73) Assignee: Stats Chippac Ltd., Singapore (SG)

( * ) Notice: Subject to any disclaimer, the term of this patent is extended or adjusted under 35 U.S.C. 154(b) by 224 days.

(21) Appl. No.: 11/694,933

(22) Filed: Mar. 30, 2007

(65) Prior Publication Data

US 2008/0242053 A1 Oct. 2, 2008

(51) Int. Cl.
*H01L 21/00* (2006.01)
(52) U.S. Cl. .................. 438/106; 438/118; 438/460; 438/463; 257/110; 257/460; 257/E21.499
(58) Field of Classification Search ............... 438/464, 438/460, 463, 106, 459, 118; 257/460, 110, 257/E21.499
See application file for complete search history.

(56) References Cited

U.S. PATENT DOCUMENTS

| | | | |
|---|---|---|---|
| 7,452,787 B2 * | 11/2008 | Miyazaki et al. | 438/464 |
| 2003/0131929 A1 * | 7/2003 | Yamamoto | 156/250 |
| 2004/0142284 A1 | 7/2004 | Sakaguchi et al. | |
| 2005/0199592 A1 | 9/2005 | Iri et al. | |
| 2006/0094208 A1 * | 5/2006 | Park et al. | 438/460 |
| 2007/0054115 A1 | 3/2007 | Codding et al. | |

\* cited by examiner

*Primary Examiner*—William M Brewster
*Assistant Examiner*—Wilner Jean Baptiste
(74) *Attorney, Agent, or Firm*—Mikio Ishimaru

(57) ABSTRACT

An integrated circuit system including: providing an integrated circuit wafer having an integrated circuit side and a backside; mounting a protective adhesive on the integrated circuit side of the integrated circuit wafer; removing material from the backside of the integrated circuit wafer; and dicing the integrated circuit wafer through the protective adhesive to form an integrated circuit die.

20 Claims, 4 Drawing Sheets

INTEGRATED CIRCUIT SYSTEM WITH A DEBRIS TRAPPING SYSTEM

TECHNICAL FIELD

The present invention relates generally to integrated circuit systems, and more particularly to integrated circuit die dicing.

BACKGROUND ART

Integrated circuits (ICs) are now universally found in electronic products from cell phones to airplanes. Continuing progress in IC technology continues to lead to higher and higher levels of circuit integration. Part of the reason for this is the computer industry's relentless drive toward higher performance, lower cost, increased miniaturization, and greater packaging density of integrated circuits. As new generations of IC products are released, the functionality of these products increases while the number of components used to fabricate them decreases.

ICs are semiconductor devices constructed from silicon (Si), gallium arsenide (GaAs), or other semiconductor material wafers through processes that comprise a large number of deposition, masking, diffusion, etching, and implanting steps. Usually, many individual devices are constructed on the same wafer. When the devices are diced into individual squares or rectangles, each square or rectangle is an IC die.

One or more IC dies are then mounted onto a package substrate in a process called die-attach, electrically connected to the package substrate in a wire or solder bonding operation, encapsulated in a packaging operation, and/or singulated into IC packages. With continuing technology improvements, packages themselves are also achieving higher and higher densities.

Because ICs are becoming smaller, they are more sensitive to particles and debris causing performance problems. The ICs are manufactured in ultra-clean environments to prevent even the smallest contamination. Since the ICs are becoming more sensitive to fine-size debris, more and more processes must be used to clean the ICs, and these chemical processes tend to use chemicals which are expensive or that contaminate the environment.

In the dicing process, protective coatings are often deposited to provide surface protection for the wafers. For ease of removal, the protective coatings are water-soluble. After various manufacturing steps, the material must be removed using high purity de-ionized water washes. As production volumes increase, more of the water-soluble materials must be used and the mixtures disposed of, which substantially increases cost.

In addition, the protective coatings are often spun, sprayed, or dip deposited, which means excess material is often deposited or it is difficult to form uniform coatings. Further, dicing frames accumulate unintentional layers of coating.

Another problem relates to the time consumed for coating and removal, which slows down the production line.

Solutions to these problems have been long sought, but prior developments have not taught or suggested any solutions and, thus, solutions to these problems have long eluded those skilled in the art.

DISCLOSURE OF THE INVENTION

The present invention provides an integrated circuit system that includes: providing an integrated circuit wafer having an integrated circuit side and a backside; mounting a protective adhesive on the integrated circuit side of the integrated circuit wafer; removing material from the backside of the integrated circuit wafer; and dicing the integrated circuit wafer through the protective adhesive to form an integrated circuit die.

Different embodiments of the invention have various aspects, which will become apparent to those skilled in the art from a reading of the following detailed description when taken with reference to the accompanying drawings.

BEST MODE FOR CARRYING OUT THE INVENTION

Figure 1:
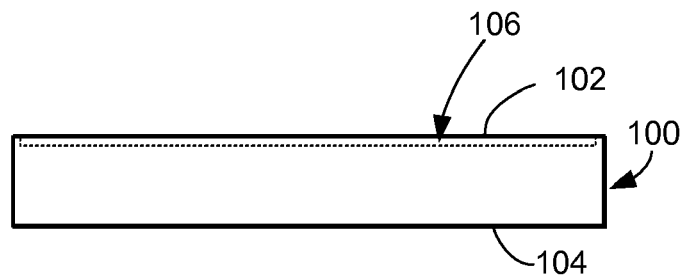
FIG. 1 is a view of an integrated circuit wafer.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. The numbering of the embodiments has been done as a matter of descriptive convenience and has no other significance.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the integrated circuit wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used.

Referring now to FIG. 1, therein is shown an integrated circuit wafer 100. The wafer 100 is a cylindrical disk and has been processed to have an integrated circuit side 102 and a backside 104. The integrated circuit side 102 contains integrated circuits 106. The wafer 100 is thick enough to be structurally rigid for being transported between various pieces of processing equipment and to allow multiple processes to be performed with a minimum deflection of the wafer 100.

Figure 2:
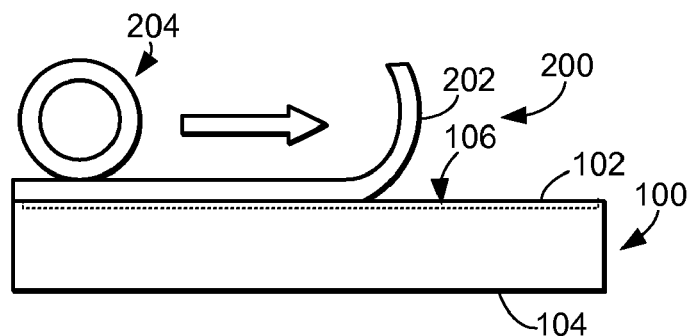
FIG. 2 is a view of the structure of FIG. 1 with a debris trapping system in accordance with an embodiment of the present invention.

Referring now to FIG. 2, therein is shown a view of the structure of FIG. 1 with a debris trapping system 200 in accordance with an embodiment of the present invention. The debris trapping system 200 includes a rolling system 204 for laminating an adhesive, such as a protective adhesive tape 202, to the integrated circuit side 102 of the wafer 100. In the laminating process, the protective adhesive tape 202 is bonded under pressure from the rolling system 204 on to the wafer 100.

Figure 3:
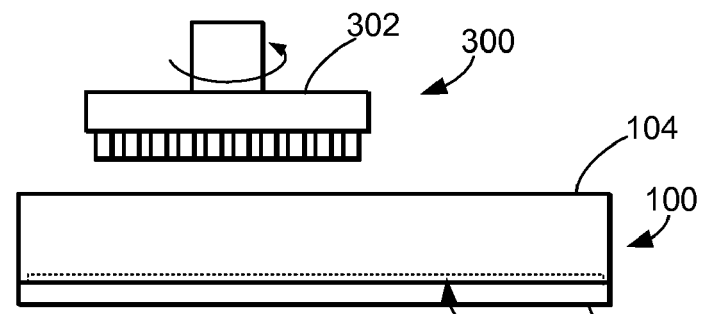
FIG. 3 is a view of the structure of FIG. 2 during backside grinding.

Referring now to FIG. 3, a view of the structure of FIG. 2 during backside grinding. The wafer 100 is in a flipped-over position in preparation of backside grinding and rests on the protective adhesive tape 202 with the backside 104 facing up on a grinding table (not shown). The protective adhesive tape 202 protects the integrated circuits 106.

A material removal system 300, such as a grinding wheel 302, removes material from the backside 104 to reduce the thickness of the wafer 100. The thinner the wafer 100, the thinner the final integrated circuit die and the thinner the final package for the final integrated circuit die. This results in higher packing densities and more functionality in smaller-size electronic products.

Figure 4:
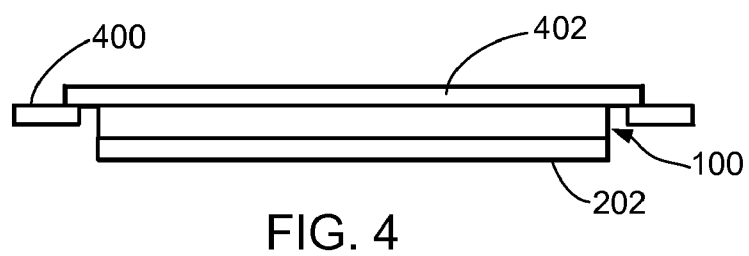
FIG. 4 is a view of the structure of FIG. 3 being prepared for dicing.

Referring now to FIG. 4, therein is shown the wafer 100 being prepared for dicing. The wafer 100 is placed in a dicing frame 400 and held in place on the dicing frame 400 with dicing tape 402.

Figure 5:
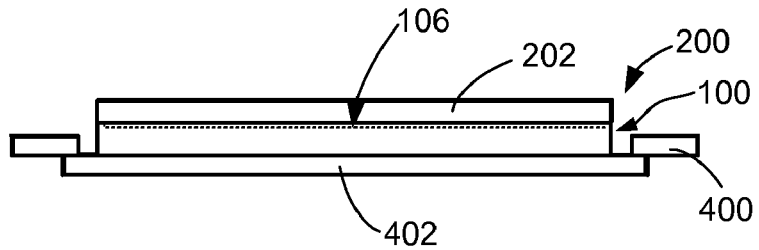
FIG. 5 is a view of the structure of FIG. 4 in a flipped over position for dicing.

Referring now to FIG. 5, therein is shown the structure of FIG. 4 in a flipped over position for dicing. After the wafer 100 is prepared for dicing, the dicing frame 400 is generally placed on a table (not shown) with the wafer 100 held by the dicing tape 402. The protective adhesive tape 202 continues to protect the integrated circuits 106 of the wafer 100.

Figure 6:
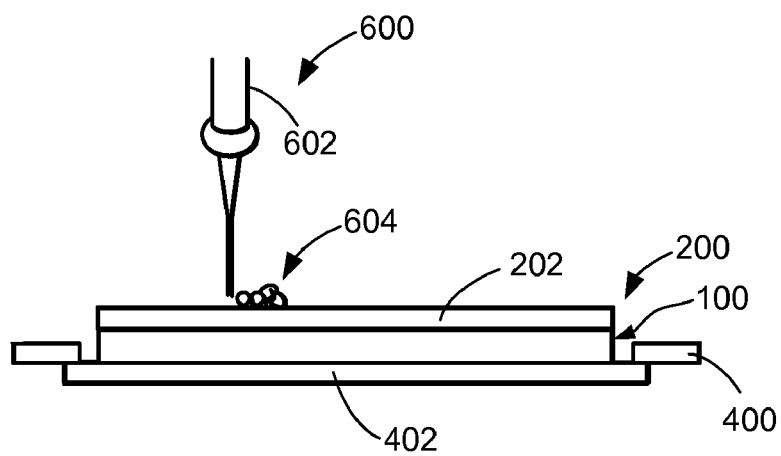
FIG. 6 is a view of the structure of FIG. 5 during dicing.

Referring now to FIG. 6, therein is shown a view of the structure of FIG. 5 during dicing. A dicing system 600 includes a dicing tool 602 and is shown at the beginning of the dicing operation. The dicing tool 602 may be a punch, saw, laser, or other dicing tool.

Regardless of the dicing tool 602 used, debris 604 is created. When a punch, saw, or other dicing tool is used, the debris 604 comes from particles of wafer material from the wafer edges or saw kerfs. When a laser is used, the debris 604 comes from ablation and vaporization while pre-forming or full-cutting a groove.

If any debris 604 reaches the integrated circuit side 102, it will adversely affect wire bonds and cause reliability problems. However, it has been found that the protective adhesive tape 202 will cause all the debris 604 that can reach the integrated circuit side 102 to adhere to it.

It has also been found that where laser dicing is used that the protective adhesive tape 202 should be transparent, at least at the optical frequencies of the laser, to assist in dicing.

Figure 7:
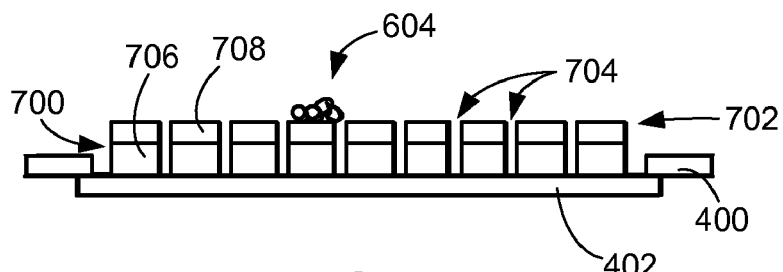
FIG. 7 is a view of the structure of FIG. 6 after dicing.

Referring now to FIG. 7, therein is a view of the structure of FIG. 6 after dicing. The wafer 100 has been diced into dice 700 with squares or rectangles of the protective adhesive tape 700 on the integrated circuit side 102. Slots 704, from which the debris 604 originates, separate the dice 700 and the protective adhesive tape 702 in a grid pattern into individual integrated circuit die 706 and pieces of individual protective adhesive tape 708.

Since the individual protective adhesive tape 708 remains adhesive, it holds the debris 604 as a part of the debris trapping system 200 of FIG. 2.

It has been discovered that the individual integrated circuit die 706 do not have heat affected zones (HAZs) due to the protective adhesive tape 202 of FIG. 2. The heat affected zones commonly occur when laser cutting forms the slots 704. Heat from the laser energy negatively affects the semiconductor material of the individual integrated circuit die 706 along the edges of the slots 704 resulting in crack propagation from stress concentrations that will damage the damage the integrated circuits 106 adjacent to the slots 704 or may degrade the semiconductor material to the point of causing current leakage or other undesirable electrical properties.

Figure 8:
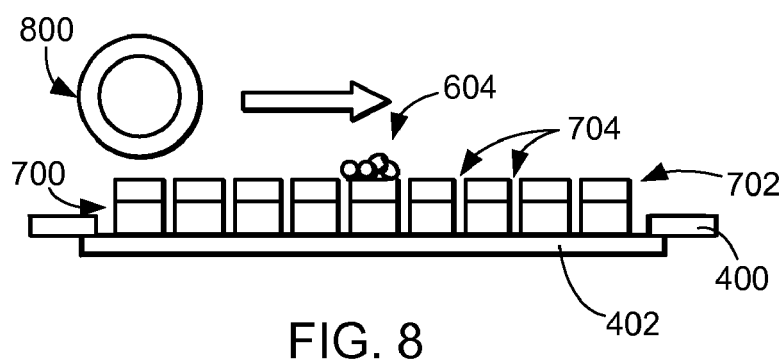
FIG. 8 is a view of the structure of FIG. 7 with the debris trapping system in operation in accordance with a first embodiment of the present invention.

Referring now to FIG. 8, therein is shown a view of the structure of FIG. 7 with the debris trapping system 200 in operation in accordance with a first embodiment of the present invention. The debris trapping system 200 includes a rolling system 800, which is rolled directly on the pieces of individual protective adhesive tape 708 so they, with the debris 604, adhere to the rolling system 800 and are removed without breaking or damaging the individual integrated circuit die 706.

Figure 9:
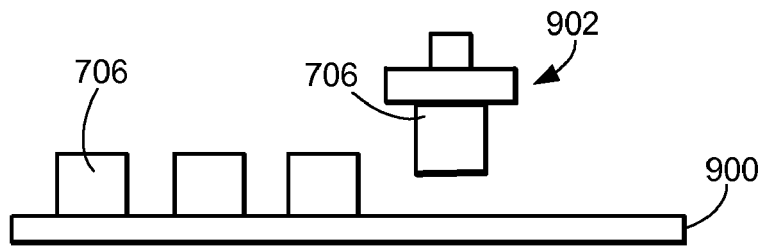
FIG. 9 is a view of an individual integrated circuit die during the step of FIG. 8 being attached to a substrate in accordance with the first embodiment of the present invention.

Referring now to FIG. 9, therein is shown a view of the individual integrated circuit die 706 during the step of FIG. 8 being attached to a substrate 900 in accordance with the first embodiment of the present invention. The individual integrated circuit die 706 is attached to the substrate using a pick-and-place machine represented by a pick-and-place head 902.

Figure 10:
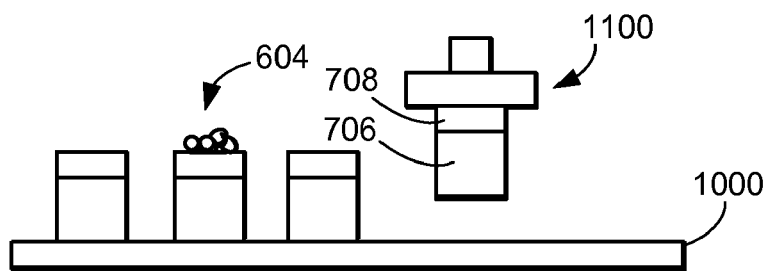
FIG. 10 is a view of an individual integrated circuit die of FIG. 7 being attached to a substrate in accordance with a second embodiment of the present invention.

Referring now to FIG. 10, therein is shown a view of an individual integrated circuit die 706 of FIG. 7 being attached to a substrate 1000 in accordance with a second embodiment of the present invention. The individual integrated circuit die 706 has the piece of individual protective adhesive tape 706 mounted to it. The individual integrated circuit die 706 is attached to the substrate 1000 using a pick-and-place machine represented by a pick-and-place head 1002.

Figure 11:
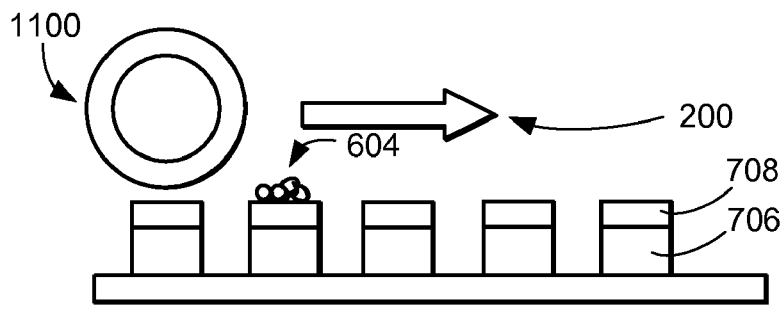
FIG. 11 is a view of the structure of FIG. 7 with the debris trapping system in operation in accordance with the second embodiment of the present invention.

Referring now to FIG. 11, therein is shown a view of the structure of FIG. 10 with the debris trapping system 200 in operation in accordance with the second embodiment of the present invention. The debris trapping system 200 includes a rolling system 1100, which is rolled directly on the pieces of individual protective adhesive tape 708 so they adhere to the rolling system 1100 and are removed with the debris 604 without breaking or damaging the individual integrated circuit die 706.

Figure 12:
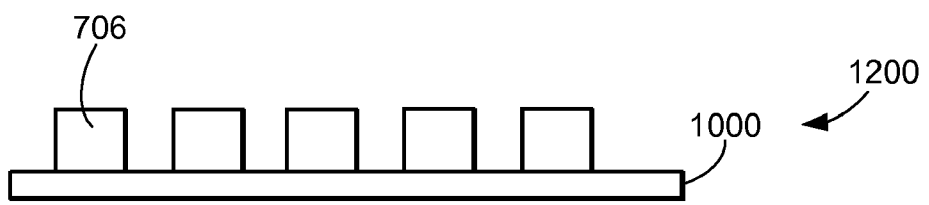
FIG. 12 a structure ready for electrical bonding, if wire or ball bonding has not occurred, encapsulation, and singulation into individual packages.

Referring now to FIG. 12, therein is shown a structure 1200 ready for electrical bonding, if wire or ball bonding has not occurred, encapsulation, and singulation into individual packages. The structure 1200 is the same for both the first and second embodiments of the present invention.

Figure 13:
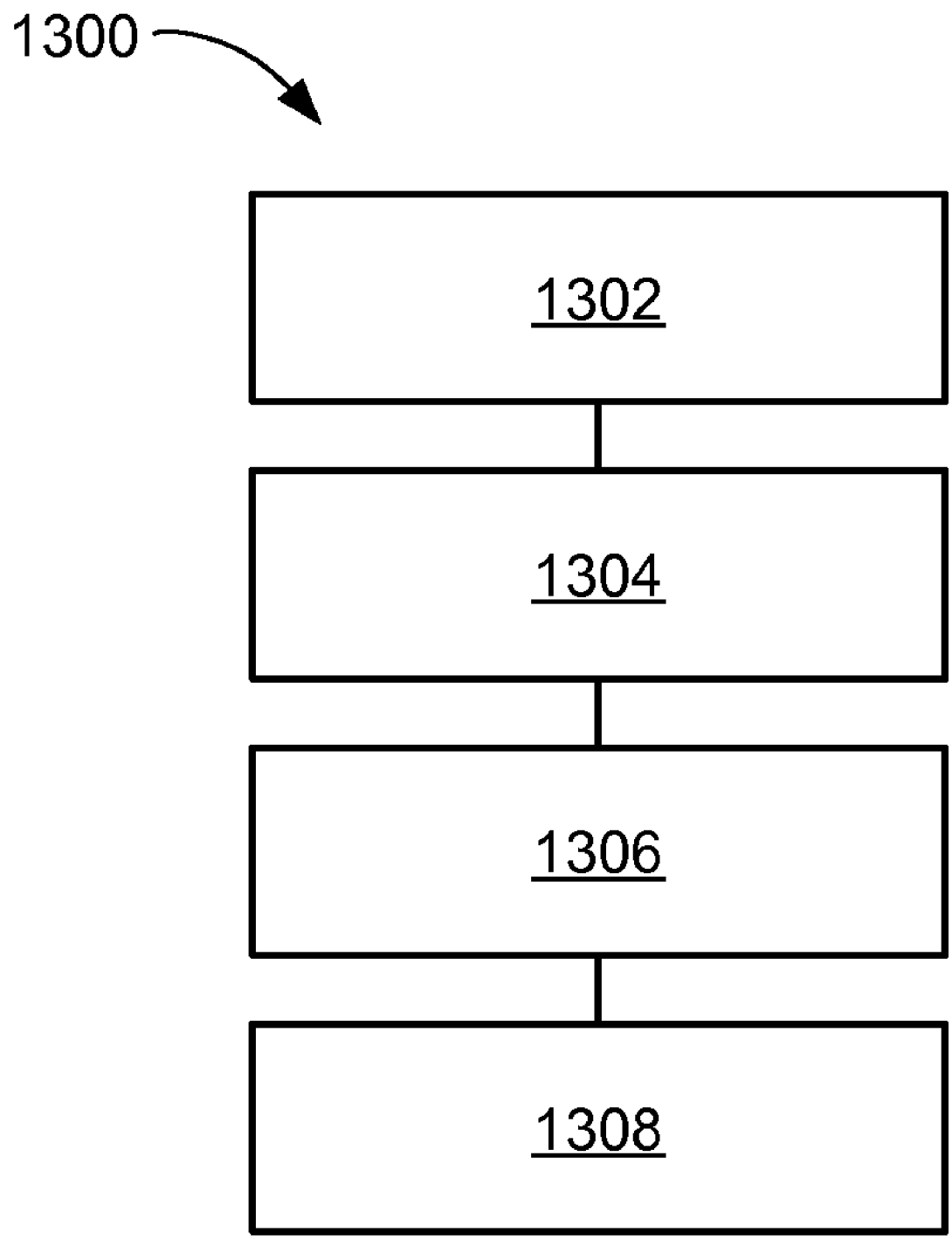
FIG. 13 is a flow chart of the integrated circuit system in accordance with a further embodiment of the present invention.

Referring now to FIG. 13, therein is shown a flow chart of the integrated circuit system 1300 in accordance with a further embodiment of the present invention. The integrated circuit system 1300 includes: providing an integrated circuit wafer having an integrated circuit side and a backside in a block 1302; mounting a protective adhesive on the integrated circuit side of the integrated circuit wafer in a block 1304; removing material from the backside of the integrated circuit wafer in a block 1306; and dicing the integrated circuit wafer through the protective adhesive to form an integrated circuit die in a block 1308.

It has been discovered that the dicing debris trapping system 200 has eliminated steps in the previous process without requiring coatings, eliminating breakage during removal of the protective adhesive tape, and avoiding wafer warpage after back-grinding despite having the protective adhesive film in place all the way through to or almost to die attach.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit system comprising:
providing an integrated circuit wafer having an integrated circuit side and a backside;
mounting a protective adhesive on the integrated circuit side of the integrated circuit wafer;
removing material from the backside of the integrated circuit wafer;
dicing the integrated circuit wafer through the protective adhesive to form an integrated circuit die; and
rolling a rolling system directly on the protective adhesive for removing the protective adhesive from the integrated circuit die.

2. The system as claimed in claim 1 wherein:
the mounting includes bonding the protective adhesive to the integrated circuit wafer.

3. The system as claimed in claim 1 further comprising:
removing the protective adhesive after dicing.

4. The system as claimed in claim 1 further comprising:
attaching the integrated circuit die with the protective adhesive mounted thereto to a substrate; and
removing the protective adhesive after attaching.

5. The system as claimed in claim 1 wherein:
the mounting the protective adhesive uses a transparent material.

6. An integrated circuit system comprising:
providing an integrated circuit wafer having an integrated circuit side and a backside;
bonding a protective adhesive tape on the integrated circuit side of the integrated circuit wafer;
preparing the integrated circuit wafer for grinding the backside thereof;
grinding material from the backside of the integrated circuit wafer;
preparing the integrated circuit wafer for dicing;
dicing the integrated circuit wafer through the protective adhesive tape to form an integrated circuit die; and
rolling a rolling system directly on the protective adhesive for removing the protective adhesive from the integrated circuit die including removing debris, formed by dicing the integrated circuit wafer, with the protective adhesive tape.

7. The system as claimed in claim 6 wherein:
the bonding laminates the protective adhesive tape under pressure.

8. The system as claimed in claim 6 further comprising:
removing the protective adhesive tape after dicing and before die attach.

9. The system as claimed in claim 6 further comprising:
attaching the integrated circuit die with the protective adhesive tape attached thereto to a substrate; and
removing the protective adhesive tape after attaching using the rolling system.

10. The system as claimed in claim 6 wherein the laminating process uses a transparent protective adhesive tape for dicing by a laser.

11. An integrated circuit system comprising:
a dicing debris trapping system for mounting a protective adhesive on an integrated circuit side of an integrated circuit wafer having an integrated circuit wafer having an integrated circuit side and a backside;
a system for removing material from the backside of the integrated circuit wafer;
a dicing system for dicing the integrated circuit wafer through the protective adhesive to form an integrated circuit die and
a rolling system for removing the protective adhesive from the integrated circuit die by rolling directly on the protective adhesive.

12. The system as claimed in claim 11 wherein:
the dicing debris trapping system is for bonding the protective adhesive to the integrated circuit wafer.

13. The system as claimed in claim 11 further comprising:
the rolling system is for removing the protective adhesive after dicing.

14. The system as claimed in claim 11 further comprising:
a pick-and-place system for attaching the integrated circuit die with the protective adhesive mounted thereto to a substrate; and
the rolling system for removing the protective adhesive after attaching.

15. The system as claimed in claim 11 wherein:
the dicing debris trapping system is for the mounting a transparent protective adhesive.

16. The system as claimed in claim 11 wherein:
the dicing debris trapping system is for bonding a protective adhesive tape on an integrated circuit side of an integrated circuit wafer having an integrated circuit side and a backside;
the system for removing material includes a system for preparing the integrated circuit wafer for grinding the backside thereof, the system for removing material is a grinding system for grinding material from the backside of the integrated circuit wafer;
the dicing system includes a system for preparing the integrated circuit wafer for dicing, the dicing system is for dicing the integrated circuit wafer through the protective adhesive tape to form an integrated circuit die; and
the rolling system for removing the protective adhesive tape includes debris, formed by the integrated circuit wafer diced, removed with the protective adhesive tape.

17. The system as claimed in claim 16 wherein:
the dicing debris trapping system is for laminating the protective adhesive tape to the integrated circuit wafer under pressure.

18. The system as claimed in claim 16 wherein:
the rolling system is for removing the protective adhesive tape after dicing and before die attach.

19. The system as claimed in claim 16 wherein:
the rolling system is for removing the protective adhesive tape after die attach.

20. The system as claimed in claim 16 wherein the dicing debris trapping system uses a transparent protective adhesive tape for dicing by a laser.

* * * * *